United States Patent [19]

Kasper et al.

[11] Patent Number: 4,912,538
[45] Date of Patent: Mar. 27, 1990

[54] STRUCTURED SEMICONDUCTOR BODY

[75] Inventors: Erich Kasper, Pfaffenhofen; Klaus Wörner, Leingarten, both of Fed. Rep. of Germany

[73] Assignees: Licentia Patent-Verwaltungs GmbH, Frankfurt am Main; Telefunken electronic GmbH, Heilbronn, both of Fed. Rep. of Germany

[21] Appl. No.: 941,223

[22] Filed: Dec. 12, 1986

[30] Foreign Application Priority Data

Dec. 20, 1985 [DE] Fed. Rep. of Germany ....... 3545244

[51] Int. Cl.$^4$ ............................................ H01L 29/72
[52] U.S. Cl. ........................................ 357/34; 357/47; 357/59
[58] Field of Search ............................ 357/59 H, 34, 47; 437/98, 99, 160, 162, 79, 168; 148/DIG. 124

[56] References Cited

U.S. PATENT DOCUMENTS

| 4,157,269 | 6/1979 | Ning | 357/59 H |
| 4,396,933 | 8/1983 | Magdo | 357/59 H |
| 4,467,519 | 8/1984 | Glang | 357/59 H |
| 4,504,332 | 3/1985 | Shinada | 148/187 |
| 4,663,831 | 5/1987 | Birrittella | 357/59 H |

FOREIGN PATENT DOCUMENTS

| 0021393 | 1/1981 | European Pat. Off. . |
| 1942838 | 2/1970 | Fed. Rep. of Germany . |
| 2053238 | 4/1971 | France . |
| 53-73087 | 6/1978 | Japan | 437/79 |
| 56-43754 | 4/1981 | Japan | 357/34 |
| 56-54063 | 5/1981 | Japan | 357/34 |
| 56-54064 | 5/1981 | Japan | 357/34 |
| 57-72373 | 5/1982 | Japan | 357/34 |
| WO8502714 | 6/1985 | PCT Int'l Appl. . |
| WO8503597 | 8/1985 | PCT Int'l Appl. . |

OTHER PUBLICATIONS

IBM Technical Disclosure Bulletin, vol. 23, #4, Sep. 1980, pp. 1487-1488 by Berger.
Y. Ota, "Silicon Molecular Beam Epitaxy", *Thin Solid Films*, vol. 106, 1983, pp. 103-106.
M. B. Rowlandson et al., "A True Polysilicon Emitter Transistor", *IEEE Electron Device Letters*, vol. EDL 6, No. 6, Jun. 1985, pp. 288-290.
Y. Suzuki, "Semiconductor Device", *Patent Abstracts of Japan*, vol. 7, No. 45, Feb. 1983, (Patent No. 57-197833 of May 29th, 1981).
H. J. Herzog et al., "Silicon Layers Grown by Differential Molecular Beam Epitaxy", *Journal of the Electrochemical Society*, vol. 132, No. 9, 1985, pp. 2227-2231.

Primary Examiner—Andrew J. James
Assistant Examiner—Mark Prenty
Attorney, Agent, or Firm—Spencer & Frank

[57] ABSTRACT

A structured semiconductor body based on a Si substrate and having monocrystalline semiconductor regions and barrier regions which contain polycrystalline silicon which have preferably been produced in an Si-MBE process. The barrier regions are provided to delimit the monocrystalline Si semiconductor structures to prevent undesired current flow, for example between twso monocrystalline devices of an integrated circuit. The polycrystalline silicon of the barrier regions has a substantially lower electrical conductivity than the monocrystalline regions, and consequently it is possible to spatially selectively dope portions the barrier region so as to provide regions which electrically contact a monocrystalline silicon region. In a preferred embodiment a polycrystalline silicon region within the barrier region is doped so that it forms a pn-junction with the adjacent monocrystalline semiconductor region and can be used, for example, as an emitter zone of a bipolar device.

11 Claims, 1 Drawing Sheet

STRUCTURED SEMICONDUCTOR BODY

BACKGROUND OF THE INVENTION

The present invention relates to a structured semiconductor body of the type comprising at least a plurality of differently doped monocrystalline silicon semiconductor regions delimited by at least one barrier region which prevents undesirable electrical current flow, as well as to a method of forming the structured semiconductor body.

The invention can be used, in particular, for the manufacture of transistors and/or integrated circuits (IC's) which are based on a silicon (Si) substrate.

A known exemplarily selected bipolar semiconductor structure of the above type which can be produced with the aid of presently customary processes, e.g. masking by means of lithography, oxidation, diffusion, implantation, epitaxy and metallization processes, is shown in FIG. 1.

According to FIG. 1, an $n^+$doped so-called buried semiconductor zone (buried layer) 2 is initially produced by the known methods on an exemplary $p^-$doped Si substrate 1, e.g. a monocrystalline Si wafer having a diameter of about 75 mm, a thickness of about 0.5 mm and a (100) crystal orientation. This is followed by the production of the semiconductor regions required for a bipolar transistor, i.e. an $n^-$doped region 3, an $n^+$doped collector contact region 4, a p doped base region 5 as well as an $n^+$doped emitter region 6 disposed within the base region 5. To avoid undesirable electrical current flow, this semiconductor structure is delimited by at least one barrier region 7, which in this example is configured as a $p^+$doped semiconductor region extending from the outer surface of the semiconductor body into the $p^{31}$ doped substrate 1. Electrical shot circuits are avoided in that this semiconductor structure is covered by an oxide layer 8, e.g. of silicon dioxide, into which contacting windows have been etched. The base terminal B, the emitter terminal E and the collector terminal C for the bipolar transistor are produced by applying a structured metal layer 9 to the outer surface of the oxide layer 8 so as to contact the regions 5, 6 and 4 respectively via the contacting windows.

In such a structured semiconductor body, the barrier region 7, which is shown, for example, as a semiconductor region doped as a blocking pn-junction, can be produced only by uneconomical insulation diffusion and/or insulation oxidation processes. The barrier region 7 is here intended to avoid undesirable current flow, e.g. between adjacent transistors of an integrated circuit.

SUMMARY OF THE INVENTION

It is therefore an object of the present invention to provide a structured semiconductor body of the above type in which, in particular, the barrier region can be produced reliably and economically and which permits reliable and economical manufacture and contacting of at least the base and emitter regions of a transistor.

The above object is generally achieved according to the invention in that in a structured semiconductor body comprising at least a plurality of differently doped monocrystalline silicon semiconductor regions formed on a silicon substrate and delimited by at least one barrier region which prevents undesirable electrical current flow between silicon semiconductor regions, the barrier region is composed at least in part of polycrystalline silicon, at least one of the monocrystalline semiconductor regions is electrically contacted by a selectively doped polycrystalline silicon zone which is provided in the polycrystalline silicon of an adjacent barrier region and which extends to the outer surface of the barrier region, and an electrical contact for the polycrystalline silicon zone is provided on the outer surface.

Preferably the barrier region comprises a layer of silicon oxide formed on the surface of the silicon substrate and a layer of polycrystalline silicon disposed on the surface of the silicon oxide layer.

According to one feature f the invention the polycrystalline silicon semiconductor zone and the contacted one of the monocrystalline silicon semiconductor regions are of the same conductivity type.

According to a further feature of the invention the polycrystalline silicon semiconductor zone and the contacted one of the monocrystalline silicon semiconductor regions are of opposite conductivity types and form a pn-junction therebetween.

According to a preferred embodiment of the invention, the plurality of monocrystalline silicon semiconductor regions form a transistor, with the contacted one of the monocrystalline semiconductor regions constituting the base zone of the transistor, and with the polycrystalline silicon semiconductor zone of opposite conductivity type constituting the emitter zone of the transistor.

The above object is likewise achieved according to the invention by a method of forming a semiconductor device on a silicon substrate which comprises the steps of: providing a monocrystalline silicon substrate of one conductivity type having a region of the opposite conductivity formed therein and extending along a portion of one major surface; covering one major surface with a layer of silicon oxide; opening two spaced windows in the oxide layer over the opposite conductivity type region; by means of differential silicon molecular beam epitaxy, simultaneously depositing monocrystalline silicon of the opposite conductivity type on the exposed portions of the region within the windows and undoped polycrystalline silicon on the outer surface of the oxide layer; introducing doping atoms which cause the first conductivity type into the monocrystalline silicon disposed within one of the windows to convert the outer surface region of this layer to the one conductivity type; selectively doping an edge region of the polycrystalline silicon layer which defines at least a portion of the one window to a depth sufficient for the edge region to contact the converted outer surface region of the layer of monocrystalline silicon within the one window; and, contacting the monocrystalline silicon within the other window and the selectively doped edge region of the polycrystalline silicon layer with respective metal contact layers.

A first advantage of the invention is that, particularly in the production of bipolar circuits, the masking and contacting processes are simplified in an economical manner.

A second advantage is that particularly small structures, e.g. smaller than 1 μm, can be realized for the emitter and/or base regions. This increases the packing density and/or switching speed of the circuit.

The invention is based on the use, to be described below, of the so called differential epitaxy on Si containing material as disclosed, for example, in the periodical, "Journal f the Electrochemical Society," Vol. 132, page 2227 (1985). In this process, a Si layer is grown on a Si substrate on which monocrystalline Si regions are disposed adjacent silicon dioxide (SiO$_2$) regions in an ultra-high vacuum system (i.e., vacuum less than 10$^{-9}$ mbar) with the aid of the silicon molecular beam epitaxy process (SiMBE). By selecting the temperature of the Si substrate and of the vacuum, i.e., type as well as partial pressure of residual gases, it is simultaneously possible to grow monocrystalline Si material on the monocrystalline Si regions while polycrystalline Si material is precipitated on the SiO$_2$ regions. The specific conductivity of the polycrystalline Si material is less by several orders of magnitude than that of the monocrystalline Si material, and thus, a precisely defined transition is created between the polycrystalline Si material and the monocrystalline Si material. Moreover, it is possible to select the growth conditions so that the polycrystalline and monocrystalline Si materials are precipitated to the same thickness. Thus, a physical step is created at the transition whose height depends only upon the thickness of the silicon dioxide layer present below the polycrystalline silicon.

The above described characteristics can be utilized to produce the exemplarily selected semiconductor structure which will be described in greater detail below.

DETAILED DESCRIPTION OF THE PREFERRED EMBODIMENTS

Figure 1:
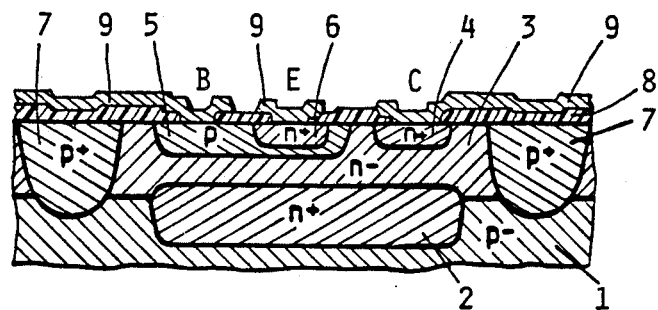
FIG. 1 is a schematic cross-sectional view of an exemplary structured semiconductor body according to the prior art showing a bipolar transistor and which can be used in particular for the production of bipolar integrated circuits.
Figure 2:
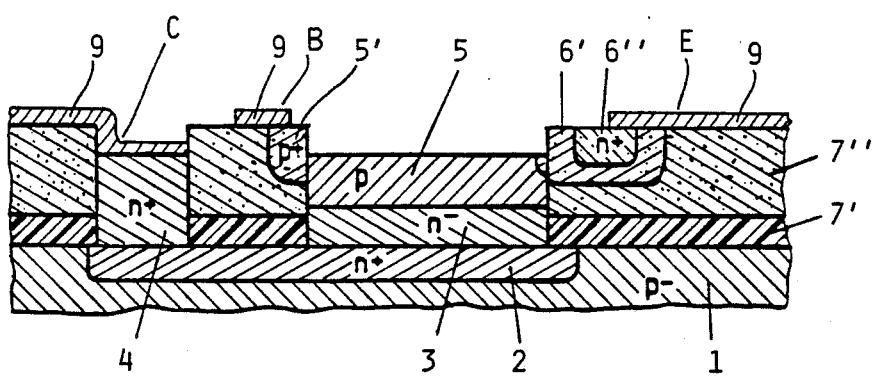
FIG. 2 is a schematic cross-sectional view of one embodiment of a structured semiconductor body according to the invention, with the illustrated device corresponding to that of FIG. 1.

Referring now to FIG. 2, wherein the same reference numerals used in FIG. 1 are used to denote corresponding structures, there is shown a p$^-$doped Si substrate 1 having, as is presently customary in the semiconductor art, an n$^+$doped buried semiconductor zone 2 in a portion of its major surface. Disposed on the major surface of the substrate 1 is a layer of silicon dioxide 7' with a overlying layer of polycrystalline silicon 7'' which together constitute a barrier region. The layer sequence 7', 7'' is provided with two windows over the buried layer 2. Disposed in one of the windows is the monocrystalline silicon collector contact region 4 which is of the same conductivity type as the buried layer 2, i.e., n$^+$as shown. Disposed on the surface of the buried layer 2 within the other window is an n$^-$type conductivity monocrystalline silicon layer 3 with an overlying monocrystalline silicon layer 5. The layer 5 forms the base zone of the illustrated transistor and is of the opposite conductivity type, p-type as shown, from the collector layer 3.

In order to contact the base zone or layer 5, a highly doped base contact region 5' of the same conductivity type is formed in the edge region of the polycrystalline silicon layer 7'' adjacent the layer 5. As shown in the contact region 5' extends from the outer surface of the layer 7'' along the edge of same which defines the window and ohmically contacts the layer 5.

The emitter zone of the transistor is formed by an n-type conductivity region 6' formed in a polycrystalline silicon layer 7'', with this region 6' contacting the p type base layer 5 to form a pn-junction. As shown this n-type polycrystalline silicon region 6' likewise extends from the outer surface of the layer 7'' along an edge region thereof which defines the window containing the layer 5 to a depth so as to contact the layer 5 and form the pn-junction at the interface. Disposed entirely within the region 6' adjacent the outer surface of the layer 7'' is an n$^+$polycrystalline silicon emitter contact region 6''.

The actual collector (c), base (B) and emitter (E) contact terminals are provided by a structured metal layer 9 which is disposed on the outer surface of the layer 7'' and which ohmically contacts the regions 4, 5' and 6'' respectively.

In order to produce the structured semiconductor body of FIG. 2, a p$^-$doped monocrystalline Si substrate containing an n$^+$doped semiconductor zone 2 is provided and covered over its entire major surface area with an SiO$_2$ oxide layer 7' having a thickness of approximately 0.2 $\mu$m. The SiO$_2$ oxide layer 7' is thermally produced at a temperature of about 950° C. Within the region overlying the buried semiconductor zone 2, two rectangular windows are then etched through the oxide layer 7' at a spacing of approximately 3 $\mu$m. The collector contact window (the window on the left in FIG. 2) has a size of 3 $\mu$m$\times$50 $\mu$m and the base/emitter window (the window on the right in FIG. 2) has a size of 6 $\mu$m$\times$50 $\mu$m. Then, the Si-MBE method is employed over the entire surface area, with n-doped silicon being deposited through antimony (Sb) at a substrate temperature of 650° C. This creates a monocrystalline silicon layer 4 and a monocrystalline silicon layer 3 within the respective windows, with each of these layers having a thickness of 0.6 $\mu$m and an Sb concentration of 1$\times$10$^{16}$/cm$^3$. Outside of the area of the windows, a polycrystalline silicon layer 7'' is produced on the oxide layer 7' to a thickness of likewise 0.6 $\mu$m. With the given layer thicknesses, the monocrystalline and polycrystalline Si regions contact one another in the illustrated manner.

The n-doped semiconductor region 4 is now n$^+$doped, e.g. with arsenic (As), in a conventional manner to produce the collector contact region of the transistor. To form the base zone of the transistor, the p-doped semiconductor layer 5 is produced in the surface of originally deposited silicon layer 3 to a thickness or depth of about 0.3 $\mu$m, e.g. by diffusion of boron (B) at a concentration of 10$^{18}$/cm$^3$. Alternatively, it is possible to epitaxially grow an n-doped region 3 to a thickness of 0.3 $\mu$m and subsequently grow the p-doped region 5 likewise epitaxially.

The emitter zone of the transistor is provided by initially forming an n$^+$doped polysilicon region 6'', e.g. by ion implantation with As ions, in the outer surface of polycrystalline silicon layer 7'' adjacent the window containing the layer 5, i.e., to the right as shown. It is important that this polysilicon region 6'' is far enough laterally removed from the adjacent monocrystalline semiconductor region 5, e.g. 1 $\mu$m, that coverage of the surface of layer 5 with doping material is avoided. By a subsequent further diffusion, e.g. at a temperature of about 1000° C., the actual contact region 6', i.e., the emitter region, is produced which forms a pn-junction with the adjacent p-doped semiconductor base region 5 at the common interface.

To contact the base region 5, a p$^+$doped polycrystalline silicon base contact region 5' is produced in the portion of the layer 7" disposed between the two windows in a conventional process. It should be noted however, that as an alternative, it is possible to produce the base contact region as a p+doped monocrystalline semiconductor region formed directly in the surface of the layer 5 as described, for example, in related Federal Republic of Germany Patent Application P 35 45 238.2, filed Dec. 20th, 1985, corresponding to U.S. Application Ser. No. 06/941,225, filed concurrently by H. J. Herzog et al, the subject matter of which is incorporated herein by reference.

As can be appreciated, in the production of the structured semiconductor by the method just described, monocrystalline, differently doped semiconductor regions 3, 4, 5 have now been created which are separated by barrier regions containing polycrystalline silicon 7".

The production of the necessary structured metallization layer 9 is performed according to presently customary methods, e.g. a lithography or lift-off method. This produces the necessary collector, base and emitter contacts C, B, E, respectively.

Since the polycrystalline silicon layer 7" has a specific electrical conductivity which is less by several order of magnitude than that of the monocrystalline Si semiconductor regions, it is surprisingly possible to integrate passive electrical resistances into the polycrystalline layer in an economical manner. For example, for this purpose a resistance region disposed in the outer surface of the layer 7" may be doped so heavily during the n+doping of the emitter region 6" in the polycrystalline silicon 7", that a useful conductivity of $10^2(\text{Ohm cm})^{-1}$ is produced in the resistance. A desired resistance value of, e.g., 10 kOhm, can then be set by way of the geometric dimensions (length, width, thickness) of the resistance region. The resistance region can then be contacted in a conventional manner by means of metal conductor paths disposed on the outer surface of the layer 7". In this way it is possible, for example, to economically produce a combination of a plurality of transistors and a passive resistance network as an integrated component.

It will be understood that the above description of the present invention is susceptible to various modifications, changes and adaptations, and the same are intended to be comprehended within the meaning and range of equivalents of the appended claims.

What is claimed is:

1. In a structured silicon body comprising at least a plurality of differently doped monocrystalline silicon semiconductor regions formed on a silicon substrate and delimited by at least one barrier region which prevents undesirable electrical current flow between silicon semiconductor regions; the improvement wherein; said barrier region comprises a layer of silicon oxide formed on the surface of said silicon substrate and a layer of polycrystalline silicon disposed on the surface of said silicon oxide layer; at least one of said monocrystalline silicon semiconductor regions is electrically contacted by a selectively doped polycrystalline silicon zone which is provided in the said polycrystalline silicon layer of an adjacent barrier region and which extends to the outer surface of said barrier region; said polycrystalline silicon semiconductor zone and said one of said monocrystalline silicon semiconductor regions are of opposite conductivity types and form a pn-junction therebetween; said polycrystalline silicon semiconductor zone includes a surface contact region which is disposed within said polycrystalline silicon zone at said outer surface and is laterally spaced from said one of said monocrystalline silicon semiconductor regions; and said surface contact region is ohmically contacted by an electrical contact and is more highly doped than the remainder of said polycrystalline silicon semiconductor zone.

2. A structured semiconductor body as defined in claim 1 wherein: at least one of said monocrystalline silicon semiconductor regions is electrically contacted by a further selectively doped polycrystalline silicon zone which is provided in said polycrystalline silicon layer of an adjacent barrier region and which extends to the outer surface of said barrier region; said further polycrystalline silicon semiconductor zone and said at least one of said monocrystalline silicon semiconductor regions are of the same conductivity type; and a further electrical contact for said further polycrystalline silicon zone is provided on said outer surface.

3. A structured semiconductor body as defined in claim 1, wherein said plurality of monocrystalline silicon semiconductor regions form a transistor, with said one of said monocrystalline silicon semiconductor regions constituting the base zone of said transistor and with said polycrystalline silicon semiconductor zone constituting the emitter zone of said transistor.

4. A structured semiconductor body as defined in claim 1 wherein said silicon oxide is silicon dioxide.

5. A structured semiconductor body as defined in claim 1 further comprising at least one doped resistance region formed in said polycrystalline silicon layer of said barrier region adjacent said outer surface.

6. A structured semiconductor body as defined in claim 1, wherein at least one of said monocrystalline silicon semiconductor regions and said polycrystalline silicon semiconductor layer of said adjacent barrier region were produced by differential silicon molecular beam epitaxy.

7. A structured semiconductor body as defined in claim 2 wherein said at least one monocrystalline semiconductor region contacted by said polycrystalline silicon zone with the opposite conductivity type and said at least one monocrystalline semiconductor region contacted by said further polycrystalline silicon zone with the same conductivity typed are the same monocrystalline semiconductor region.

8. A transistor comprising: a monocrystalline silicon substrate of one conductivity type having a first region of the opposite conductivity type formed along a portion of one major surface; a layer of silicon oxide formed on said one major surface; a layer of polycrystalline silicon disposed on and covering said oxide layer; first and second spaced windows extending through said polycrystalline silicon and said oxide layers over said first region; a second monocrystalline silicon region of said opposite conductivity type formed on and covering the portion of said first region within said first window; a third monocrystalline silicon region of said opposite conductivity type formed on and covering the portion of said first region within said second window; a fourth monocrystalline silicon region of said first conductivity type disposed on and covering said third monocrystalline silicon region within said second window and forming a pn-junction with said third region; a polycrystalline silicon region of said opposite conductivity type disposed along a portion of the outer surface of said polycrystalline layer adjacent one edge of said second window and contacting said fourth monocrystalline silicon region to form a pn-junction with same;

and respective first, second and third contact means for ohmically contacting said second monocrystalline region, said fourth monocrystalline silicon region and said polycrystalline silicon region.

9. A transistor as defined in claim 8 wherein said third contact means includes a polycrystalline silicon contact region of said opposite conductivity type formed entirely within said polycrystalline silicon region and adjacent said outer surface, with said contact region being more highly doped than the remainder of said polycrystalline silicon region, and a metal contact disposed on said outer surface and ohmically contacting at least said contact region.

10. A transistor as defined in claim 9 wherein said second contact means comprises: a further polycrystalline silicon contact region of said one conductivity type disposed along a portion of said outer surface of said polycrystalline silicon layer and extending from said outer surface along an edge of said polycrystalline silicon layer defining said second window and contacting said fourth monocrystalline silicon region; and metal contact disposed on said outer surface and ohmically contacting said further polycrystalline silicon contact region.

11. A transistor as defined in claim 8 wherein the thickness of said polycrystalline silicon layer, the thickness of said second monocrystalline silicon region and the total thickness of said third and fourth monocrystalline silicon regions are all equal.

* * * * *